United States Patent [19]

Kontani et al.

[11] Patent Number: 5,195,049
[45] Date of Patent: Mar. 16, 1993

[54] DIGITAL FILTER SYSTEM WITH ANOMALY DETECTION AND INDICATION

[75] Inventors: Tetsuro Kontani, Yokohama; Yutaka Miki, Hirakata, both of Japan

[73] Assignee: LSI Logic Corp., Milpitas, Calif.

[21] Appl. No.: 483,584

[22] Filed: Feb. 22, 1990

[30] Foreign Application Priority Data

Feb. 23, 1989 [JP] Japan .................................. 1-41894

[51] Int. Cl.$^5$ ................................................ G06F 7/38
[52] U.S. Cl. ............................. 364/724.03; 364/724.16
[58] Field of Search ...................... 364/724.03, 724.16, 364/724.19

[56] References Cited

U.S. PATENT DOCUMENTS

| | | | |
|---|---|---|---|
| 3,609,568 | 9/1971 | Jackson | 364/724.03 |
| 3,700,874 | 10/1972 | Heightley | 364/724.03 |
| 3,725,687 | 4/1973 | Heightley | 364/724.03 |
| 4,021,654 | 5/1977 | Harris et al. | 364/724 |
| 4,104,729 | 8/1978 | Cringell | 364/724.03 |
| 4,305,133 | 12/1981 | Amada et al. | 364/724.03 |
| 4,507,725 | 3/1985 | Christopher et al. | 364/724.03 |
| 4,920,507 | 4/1990 | Takeda | 364/724.03 |

OTHER PUBLICATIONS

Landaurio et al, "On Overflow Detection and Correction in Digital Filters", IEEE Trans. on Computers, vol. C-24, #12, pp. 1226–1228, Dec. 1975.
Drumm, "Saturation Adder Solves Overflow Problems in 2nd-Order Filters", Electronic Design, vol. 28, #18, pp. 167–168, Sep. 1980.
Liu, "Effect of Finite Word Length on the Accuracy of Digital Filters-A Review", IEEE Trans. on Circuit Theory, vol. CT-18, No. 6 Nov. 1971, pp. 670–677.
Introduction to Adaptive Filtering, pub Gendai Kogakusha, Sep. 10, 1987, pp. 6–7.
Inserting a ghost-canceler-control/reference signal in the television broadcast signal, *Nikkei Electronics*, Oct. 19, 1987, v 432, pp. 213–225.

Primary Examiner—Tan V. Mai
Attorney, Agent, or Firm—Michael D. Rostoker; Gerald E. Linden

[57] ABSTRACT

A digital filter, and more particularly a digital filter such as a transversal filter, is disclosed which is comprised of digital filter modules and provided with a function to detect the occurrence of anomalies such as overflow (a state in which excessively large or small absolute values exceeding an allowable limit are produced during arithmetic operations).

3 Claims, 2 Drawing Sheets

DIGITAL FILTER SYSTEM WITH ANOMALY DETECTION AND INDICATION

CROSS REFERENCE TO RELATED APPLICATIONS

Attention is directed to commonly-owned, copending U.S. Pat. application Ser. No. 483,586, entitled Digital Filter with Anomaly Detection and Indication, filed on Feb. 22, 1990 by Kontani, and to U.S. patent application Ser. No. 483,585, entitled Arithmetic Unit Using a Digital filter forming a Digital Signal Processing System with Signal Bypass, filed on Feb. 22, 1990 by Kontani.

FIELD OF INVENTION

The present invention relates to a digital filter system, such as a transversal filter, and to modular elements for such a system.

DESCRIPTION OF THE PRIOR ART

A transversal filter, also referred to as a tapped delay line filter, provides an output signal derived by multiplying preceding input sample values obtained via delay elements by a filter coefficient and adding the signals obtained from each delay element. If Ai is the filter coefficient, X the input signal (sample value) series, Y the output signal series and the number of delay taps, this can be expressed mathematically by $$Y(n) = \sum_{i=0}^{l-1} A_i \cdot X(n-i)$$

FIGS. 5 (A) and (B) show examples of the hardware configuration of transversal filters. In the drawings reference numeral 1 denotes a delay element (R), 2 a multiplier (X) and 3 an adder (+). A delay element 1, multiplier 2 and adder 3 constitute one tap.

FIG. 5 (A) shows a transposed-type transversal filter and FIG. 5 (B) a direct-type transversal filter. These filters multiply each of the signals input during a preceding sampling time by a predetermined filter coefficient and then add the signals to produce an output signal at a current time. The delay element 1 is constituted as an edge trigger shift register and the multiplier 2 is constituted as a memory register in which the filter coefficient is stored. In some arrangements as suitable pipeline register is provided between adders.

Some transversal filters use a sum-of-products computer such as the one shown in FIG. 6 denoted by the reference numeral 4. These are differentiated from the filters illustrated in FIG. 5 by whether the Xo of the data input to the filter can be derived bit by bit, or only the initial data of a data block.

In either embodiment, the output signal in the direct-type transversal filter can be expressed by $$Y(n) = A_0 X_n + A_1 X_{n-1} + \ldots + A_{l-1} X_{n-l+1}$$

and in the transposed-type transversal filter by $$Y(n) = (A_0 X_n + (A_1 X_{n-1} + (\ldots + (A_{l-1} X_{n-l+1}))\ldots)))$$

In a digital filter the filtering is effected by digital processing. As this offers a high degree of precision and is suited to adaptive control and the like, digital filtering is used in many fields. Moreover, the recent advances in LSI technology enable such filters to be fabricated as single modules or as a combination of multiple modules which are compact and highly reliable.

As an example of adaptive control, an unknown system can be modeled by generating an error signal between a signal from the transversal filter and a signal from a target system and automatically adjusting the filter coefficients in accordance with this error signal (see pages 6 and 7 of "Introduction to Adaptive Filtering" published by Gendai Kogakusha Sep. 10, 1987).

Transversal filters are also used in ghost cancelers. Ghosting is usually caused by a phenomenon that a television signal reflected by obstacles such as tall buildings and mountains is superimposed on a signal received directly, i.e., without being reflected by any such obstacle. That is, a ghost signal is produced by the propagation of the original transmission signal along various paths, causing a kind of modulation of the transmission time, amplitude and phase of the input signal. A ghost canceler cancels ghost signals by passing the input signal through a transversal filter in which the filter coefficient can be varied.

A method for inserting a ghost-cancelling reference signal in the broadcast signal to control ghost cancelers is described in an article entitled "Inserting a ghost-canceler-control reference signal in the television broadcast signal" published in issue number 432 of Nikkei Electronics, Sep. 19, 1987, pages 213–225.

The principle involved is illustrated in FIG. 7. An input signal f(t) is input directly into an adder 11, and is also input into a one-dimensional transversal filter 10 whose output signal is added to the original input signal by the adder 11. The output of the adder 11 is fed into a filter coefficient controller 12, which receives a reference signal Ref. To cancel the ghost signals described above, the filter coefficients of the transversal filter 10 are adjusted so that the output signal derived from the adder 11 within a period of insertion of the ghost-cancelling reference signal into the input signal f(t) may coincide with the reference signal Ref.

Ghost signals will be dependent on the various physical conditions of the signal propagation path on the transmission and receiving sides. Such conditions include the presence of structure, vibration, the angles concerned, reflection of the waves, vibration of the transmitting and/or receiving antennas, wind direction and wind speed, temperature, humidity and other three-dimensional physical conditions. Therefore, to prevent the appearance of ghost signals, it is required to use an adaptive control to change the coefficients of the transversal filter 10 from moment to moment.

Such a transversal filter is usually realized as a single LSI chip, or as a plurality of the same type of LSI chips with a plurality of taps provided in the LSI chips. Overflow can occur unless the transversal filter is arranged in such a manner that the adder nearest the output side has a higher number of bits. However, as in an ordinary transversal filter the bit width and bit range of the adder of each tap is fixed, there would occur an overflow at each tap of the transversal filter. The occurrence of overflow or other such anomalies can lead to generation of an inaccurate output signal at the tap concerned, thus making the predetermined filter characteristics unobtainable. Overflow therefore gives rise to the problem of how it should be communicated to the system, and how the system should respond.

As conventional transversal filters lack means for dealing with such anomalies, the occurrence of such anomalies has either rendered the predetermined characteristics unobtainable or has caused the entire system to malfunction.

The object of the present invention is to solve the above problems by providing an anomaly detector in a digital filter that enables overflow and other anomalies to be detected promptly in order to take corresponding measures.

SUMMARY OF THE INVENTION

To solve the above problems, the present invention uses an arrangement in a digital filter comprised of a plurality of digital filter modules, characterized in that an anomalous signal produced in one of the digital filter modules is derived and logic-processed in a digital filter module in the next stage in combination with an anomalous signal produced therein for detection of anomalies, such as an overflow condition, in the digital filter.

In a digital filter comprised of a plurality of digital filter modules according to the invention, an anomalous signal produced in one of the digital filter modules is derived and logic-processed in a digital filter module in the next stage in combination with an anomalous signal produced therein for detection of anomalies in the digital filter. This arrangement enables the anomaly in the whole digital filter to be detected promptly with the reduced and simplified elements and wirings.

Figure 1:
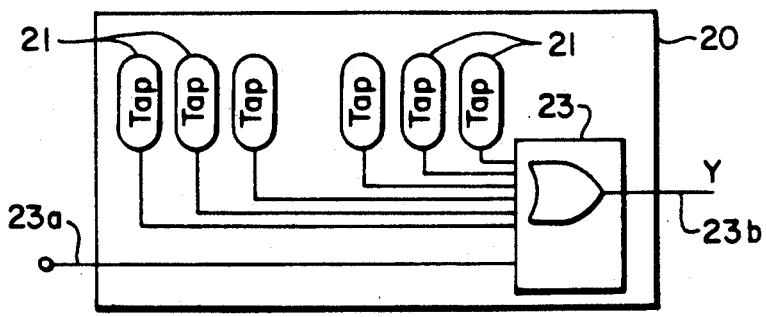
FIGS. 1 is a block diagram showing a circuit arrangement for detecting anomalies in one of transversal filter modules according to the invention.

20, 30: transversal filter module (TFM)
21: tap which constitutes a transversal filter (Tap)
22: signal line
23: OR gate
23a: input
23b: output
28: overflow analysis logic circuit
31: D-flip-flop

DESCRIPTION OF THE EMBODIMENTS

Details of the present invention will now be described with reference to the embodiments illustrated in the drawings.

Figure 5A:
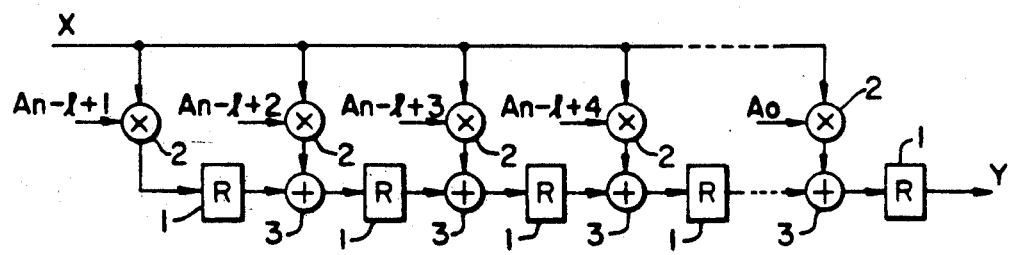
FIGS. 5 (A) and (B) and FIG. 6 are circuit diagrams of conventional transversal filter arrangements.
Figure 5B:
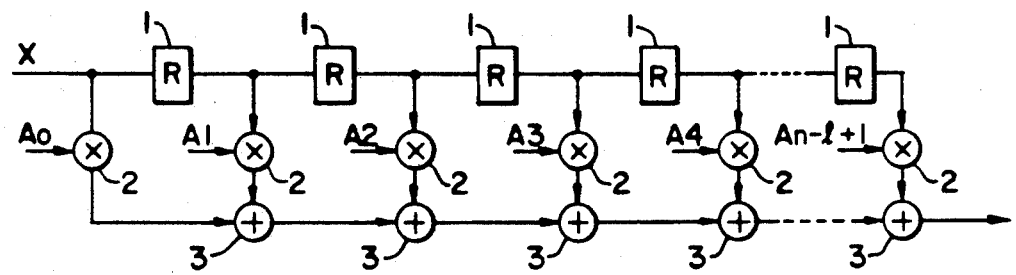
Figure 6:
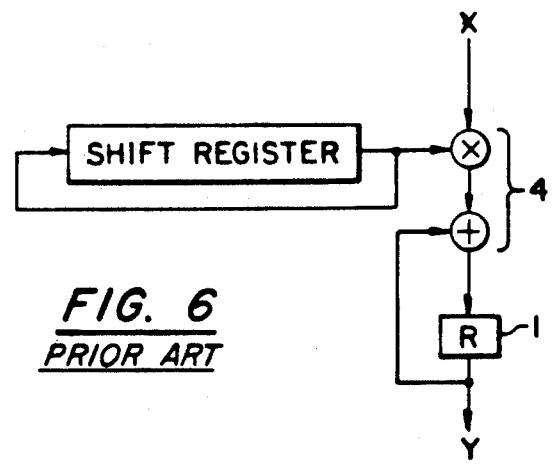
Figure 7:
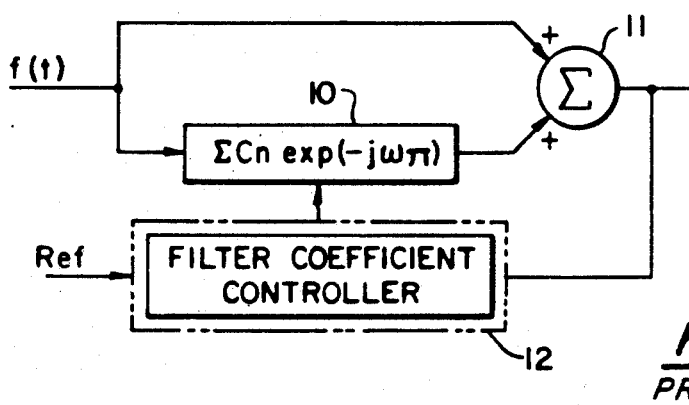
FIG. 7 is a block diagram of a ghost canceler.

FIG. 1 shows an arrangement in which the invention is applied to a transversal filter comprised of a plurality of modules. A transversal filter module 20 includes a plurality of taps 21 each of which comprises a delay element 1, a multiplier 2 and an adder 3, as shown in FIG. 5. When overflow occurs in the adder 3, an overflow output having an H-level is produced at an output signal line 22. The output signals from each of the taps 21 in the module 20 are fed to an OR gate 23 which serves to do the logical sum processing. The OR gate 23 further receives another logical sum signal 23a from the preceding module 20. The logical sum of these signals correspond to an output signal from the OR gate 23.

Figure 2:
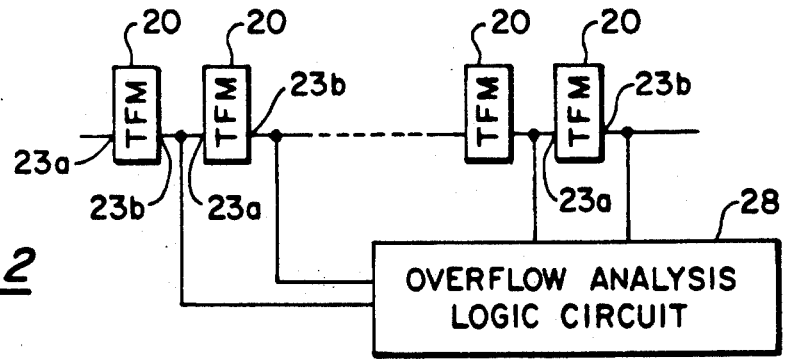
FIG. 2 is a block diagram showing a transversal filter comprised of a plurality of modules according to the invention.

As is more clearly seen from FIG. 2, the logical sum signal from the one module 20 forms an input signal to the module in the next stage. That is, the logical sum from the overflow outputs in the taps 21 in the module is logically combined with an anomalous signal from the outside of the module, i.e. from the preceding module to derive therefrom an output signal. When the overflow output from the module takes an H-level, it is combined with an overflow input to the next module. The H-level output in the module in the final stage indicates that at least one of the modules in the transversal filter produced an anomalous signal.

This means that the production of any overflow output represents the occurrence of overflow not only in the module concerned, but also in the preceding module. In this arrangement, the overflow outputs are not logically processed outside the module, but within the module and the output signal is sequentially transferred to the following module in a cascaded manner. This enables the reduction in wiring and also the reduction in surface area for the wiring. This arrangement is very preferable form the point of view of wiring on a printed circuit board in case where the overflow output in the preceding module is disposed closely to the input to the following module. to identify which module an overflow came from, an arrangement as shown in FIG. 2 is used in which overflow outputs from the taps are input to an overflow analysis logic circuit 28.

The embodiment as shown in FIG. 2 is of an asynchronous type. This makes the circuit arrangement simple, but the circuit is disadvantageously affected by factors such as temperature, supply voltage, process fluctuation or the like when the semiconductors increase in number because the signal passes through the semiconductor.

Figure 3:
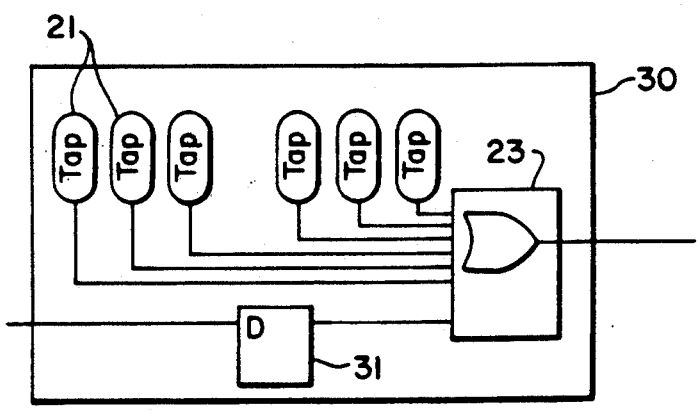
FIGS. 3 and 4 are circuit diagrams each showing an embodiment for detecting anomalies synchronously.
Figure 4:
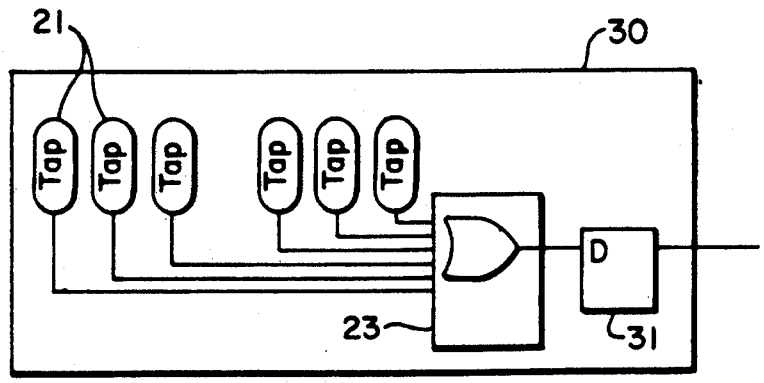

To solve this problem, a detector of a synchronous type is proposed as shown in FIGS. 3 and 4. As shown in FIG. 4, an overflow output from the preceding module is not directly supplied to the OR gate 23, but to a D-flip-flop 31 in a transversal filter module 30, once stored therein and then read out in synchronism with a clock to derive therefrom the logical sum of the overflows.

A plurality of such transversal filter modules 30 are connected in a manner as shown in FIG. 2. This arrangement enables the circuit to be stabilized by clock-synchronization, so that it is less affected by factors such as the temperature, supply voltage, or process fluctuation, although the signal passes through the semiconductor. Therefore, it never happens that it becomes impossible to identify which module produced the overflow.

A storage by means of the D-flip-flop can be made by an arrangement as shown in FIG. 4 in which the overflow output is directly fed to the flip-flop in the transversal filter module for logical sum with the other overflows arising in the module, or by an arrangement as shown in FIG. 4 in which all the overflow outputs in the same module are supplied to the OR gate 23 for logical sum with its output stored in a memory such as a D-flip-flop.

While the anomaly described in the foregoing embodiments is overflow arising in a transversal filter, the invention is not limited to the detection of overflow. Instead, the same arrangements can be used to detect other anomalies, such as anomalies arising in the multiplier, for example.

The present invention is not limited to a transversal filter but may be applied to other digital filters.

The transversal filter modules in the embodiments described above can be realized as integrated circuit chips, as discrete circuits, or as hybrid circuits that combine both types.

As has been described in the foregoing, the present invention uses an arrangement in a digital filter comprised for a plurality of digital filter modules, wherein an anomalous signal produced in one of the digital filter modules is derived and logic-processed in a digital filter module in the next stage in combination with an anomalous signal produced therein for detection of anomalies in the digital filter. This arrangement enables the anomaly in the whole digital filter to be detected promptly with the reduced and simplified elements and wirings, also enabling countermeasures to be taken for compensation for the occurrence of the anomalies.

We claim:

1. A digital filter system comprising:
    a series of transversal filter modules, each transversal filter module comprising:
    a plurality of multipliers;
    a plurality of adders, each adder having an overflow output;
    a plurality of delay elements;
    a plurality of filter coefficient inputs;
    a signal input;
    a signal output;
    an overflow signal input; and
    means for indicating anomalies, having a plurality of inputs and an output;
    wherein:
    the multipliers, adders, delay elements, filter coefficient inputs, signal input, and signal outputs are interconnected as a transversal digital filter circuit; and
    the means for indicating anomalies receives at its inputs the overflow outputs of the adders and provides at its output a signal indicating whether any of the adder overflow outputs is active; and
    wherein, for the system:
    the outputs of the means for indicating anomalies of each module are connected to the signal input of the next module in the series; and
    the output of the means for indicating anomalies for the last module in the series indicates the overflow status of the entire filter system.

2. A digital filter system according to claim 1, wherein:
    each of said multipliers in each module includes an overflow output; and
    the means for indicating anomalies in each module receives at its inputs the overflow outputs of the multipliers and provides at its output a signal indicating whether any of the multiplier overflow outputs is active.

3. A digital filter system according to claim 1, further comprising:
    means for identifying which module produces an anomaly.

* * * * *

UNITED STATES PATENT AND TRADEMARK OFFICE
CERTIFICATE OF CORRECTION

PATENT NO. : 5,195,049

DATED : March 16, 1993

INVENTOR(S) : Kontani & Miki

It is certified that error appears in the above-identified patent and that said Letters Patent is hereby corrected as shown below:

On title page, item [73],
Assignee should read "LSI Logic Corp., Milpitas, Calif." -- and Matsushita Electric Industries Co., Ltd., Kadoma-shi, Osaka, Japan --

Signed and Sealed this

Thirty-first Day of December, 1996

*Attest:*

BRUCE LEHMAN

*Attesting Officer*     *Commissioner of Patents and Trademarks*